United States Patent
Ferber et al.

(10) Patent No.: US 6,597,585 B2
(45) Date of Patent: Jul. 22, 2003

(54) POWER SEMICONDUCTOR MODULE

(75) Inventors: Gottfried Ferber, Warstein (DE); Reimund Pelmer, Soest (DE)

(73) Assignee: Eupec Europaeische Gesellschaft fuer Leistungshalbleiter GmbH & Co. KG, Munich (DE)

( * ) Notice: Subject to any disclaimer, the term of this patent is extended or adjusted under 35 U.S.C. 154(b) by 0 days.

(21) Appl. No.: 09/954,411

(22) Filed: Sep. 17, 2001

(65) Prior Publication Data
US 2002/0033529 A1 Mar. 21, 2002

Related U.S. Application Data

(63) Continuation of application No. PCT/DE00/00595, filed on Mar. 1, 2000.

(51) Int. Cl.[7] .................................................. H05K 7/00
(52) U.S. Cl. ........................ 361/820; 361/764; 361/783; 361/793; 257/778; 257/698
(58) Field of Search ........................... 361/820, 768, 361/771, 772, 779, 783, 793, 764, 760; 257/778, 698, 703, 704, 707, 723; 174/106 SC

(56) References Cited

U.S. PATENT DOCUMENTS

| | | | |
|---|---|---|---|
| 5,243,217 A | * | 9/1993 | Yamada ........................ 257/692 |
| 5,444,297 A | | 8/1995 | Oshima et al. |
| 5,876,859 A | * | 3/1999 | Saxelby, Jr. et al. ........ 428/621 |

FOREIGN PATENT DOCUMENTS

| | | |
|---|---|---|
| DE | 36 04 313 A1 | 8/1987 |
| DE | 39 37 045 A1 | 5/1991 |
| EP | 0 513 410 A1 | 11/1992 |
| EP | 0 588 094 A1 | 3/1994 |
| EP | 0 609 528 A1 | 8/1994 |
| EP | 0 716 450 A1 | 6/1996 |
| EP | 0 722 235 A2 | 5/1997 |
| EP | 0 844 781 A2 | 12/1998 |

OTHER PUBLICATIONS

Haartsen, Jaap et al.: "Bluetooth: Vision, Goals, and Architecture", Mobile Computing and Communications Review, vol. 2, No. 4, pp. 38–45, XP–000784002.
Kurki, Teppo: "JINI—An Environment for Spontaneous Federation of Networked Services", XP–002141073.
Schwartz, Ephraim: "Sun lets Jini out of the bottle", dated Jan. 26, 1999, XP–002141074.
Anonymous: "Jini™ Technology and Emerging Network Technologies", XP–002141075.

* cited by examiner

*Primary Examiner*—David Martin
*Assistant Examiner*—Hung Bui
(74) *Attorney, Agent, or Firm*—Lawrence A. Greenberg; Werner H. Stemer; Ralph E. Locher

(57) ABSTRACT

A power semiconductor module includes a plastic housing, a plurality of connection elements for external main connections and control connections, and at least one ceramic substrate which is provided at least on its top side with a structured metalization. The at least one ceramic substrate is fitted with semiconductor components and is inserted into a bottom opening of the plastic housing. The connection elements for the external main connections and control connections are connected by detaching a part of the structured metalization from the at least one ceramic substrate and bending it vertically upward to form a grip tab so that the grip tab can be connected to a connection element through the use of a brazed joint or a welded joint. These measures ensure an excellent stability with regard to fluctuating thermal loads.

18 Claims, 3 Drawing Sheets

POWER SEMICONDUCTOR MODULE

CROSS-REFERENCE TO RELATED APPLICATION

This application is a continuation of copending International Application No. PCT/DE00/00595, filed Mar. 1, 2000, which designated the United States.

BACKGROUND OF THE INVENTION

Field of the Invention

The invention relates to a power semiconductor module which includes a plastic housing, a plurality of connection elements for external main connections and control connections and at least one ceramic substrate. The at least one ceramic substrate has at least on its upper side a structured metalization, is fitted with semiconductor components and is inserted into a bottom opening of the plastic housing.

A power semiconductor module of this type is for example described in detail in Published, Non-Prosecuted German Patent Application No. DE 36 04 313 A1.

The ceramic substrates used in these power semiconductor modules usually are formed of aluminum oxide $Al_2O_3$ or AlN and are provided with solderable conductor tracks, i.e. a structured metalization.

In the case of the ceramic substrates, which are formed of aluminum oxide, these conductor tracks are produced by a direct copper bonding process, whereas, in the case of ceramic substrates, which are formed of aluminum nitride, the conductor tracks are produced by an active metal brazing process. Both processes have been extensively described in the prior art.

The load connections and control connections are butt-soldered onto the connection surfaces provided on these solderable conductor tracks, as metal angle-brackets, end wires or stamped-and-bent parts. To compensate for tensile and flexural loads which occur, compensating curves or arcs, for example, are provided in the load connections and the control connections. However, the joints produced in this way frequently have problems with regard to the mechanical reliability of the joints.

Furthermore, the use of load and control connections in combination with compensating curves requires a greater amount of space, and consequently restrictions are imposed on the miniaturization of the power semiconductor modules.

Connection tabs, which project beyond the outer edges of the ceramic substrates are generally welded or soldered to connection plugs or load connections.

SUMMARY OF THE INVENTION

It is accordingly an object of the invention to provide a power semiconductor module which overcomes the above-mentioned disadvantages of the heretofore-known power semiconductor modules of this general type and which ensures increased mechanical reliability in the joints of the load connections and/or the control connections to the ceramic substrate and, at the same time, takes up less space for the load and/or control connections.

With the foregoing and other objects in view there is provided, in accordance with the invention, a power semiconductor module, including:

a plastic housing having a bottom opening formed therein;

a plurality of connection elements for external main connections and control connections;

at least one ceramic substrate having an upper side and being inserted into the bottom opening of the plastic housing;

semiconductor components provided on the at least one ceramic substrate;

a structured metalization provided at least at the upper side of the at least one ceramic substrate, at least a part of the structured metalization being detached from the at least one ceramic substrate and being bent vertically upward for forming a grip tab; and the grip tab being joined to one of the connection elements.

In other words, the object of the invention is achieved by a power semiconductor module of the type described in the introduction which is characterized in that at least a part of the structured metalization has been detached from the ceramic substrate and has been bent vertically upward to form a grip tab or holding tongue, and in that the grip tab is joined to a connection element for external connections or terminals.

In this procedure, parts of the metalization are detached from the metalization of the ceramic substrates at the required connection points and are bent vertically upward. The load and/or control connections, which lead to the outside are attached to these grip tabs which are formed within the ceramic substrates. The grip tabs are typically joined to the connection elements by a brazed (hard-soldered) joint or a welded joint, so that a significantly stronger and mechanically more reliable joint can be produced.

With the soft-soldered joints, which have hitherto been produced in the prior art, it was impossible to achieve a strength, which equals that of a brazed or a welded joint.

This measure allows a reliable, temperature-resistant joint to be produced between the metalization on the ceramic substrate and the connection element, and in particular no filler or additional material is required when forming the joint as a welded joint. Consequently, the mounting times can be reduced considerably.

Furthermore, these measures enable the power semiconductor modules to be miniaturized further, since there is no need for compensating curves or arcs in the load and/or control connections.

Furthermore, relatively short load connections with a large line cross section can be realized. Load connections of this type have a significantly lower electrical resistance than the load connections used in the prior art.

Finally, the measures according to the present invention mean that there are no insulation problems caused by parts of the ceramic substrates breaking off. The breaking of the ceramic substrates is caused by an excessive notch action below solid accumulations of material of connection elements in the event of thermal load changes.

Overall, the present invention enables power semiconductor modules, which are significantly more reliable than those used in the prior art and have smaller dimensions.

According to another feature of the invention, at least one ceramic substrate is an aluminum oxide substrate including $Al_2O_3$ or an aluminum nitride substrate including AlN.

According to yet another feature of the invention, the structured metalization is a copper metalization.

According to a further feature of the invention, the structured metalization has a surface; and a nickel layer is provided on the surface of the structured metalization.

According to another feature of the invention, the plastic housing includes a frame and a cover.

According to yet another feature of the invention, the cover has openings formed therein, and at least some of the connection elements are guided through the openings.

Other features which are considered as characteristic for the invention are set forth in the appended claims.

Although the invention is illustrated and described herein as embodied in a power semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
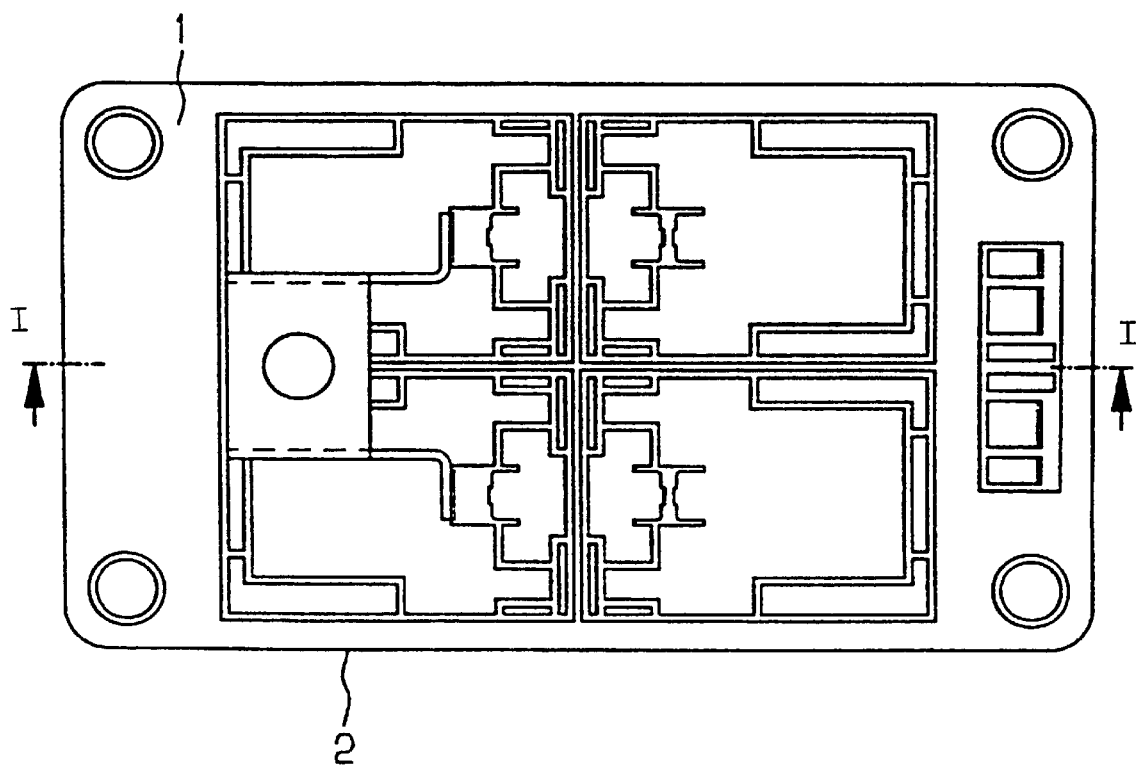
FIG. 1 is a diagrammatic plan view of a power semiconductor module with the housing cover removed.
Figure 2:
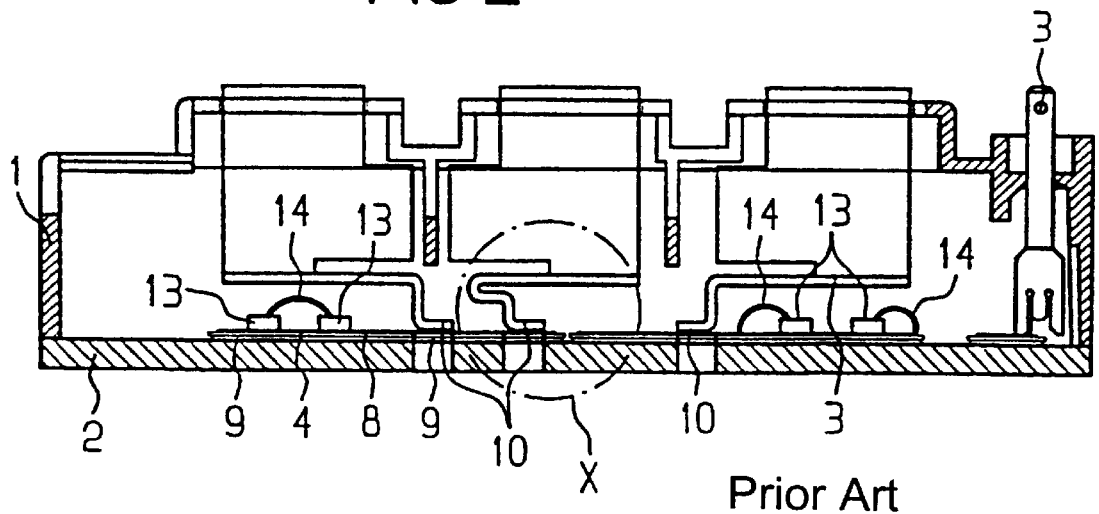
FIG. 2 is a sectional side view of a conventional power semiconductor module in the section plane I—I shown in FIG. 1.
Figure 3:
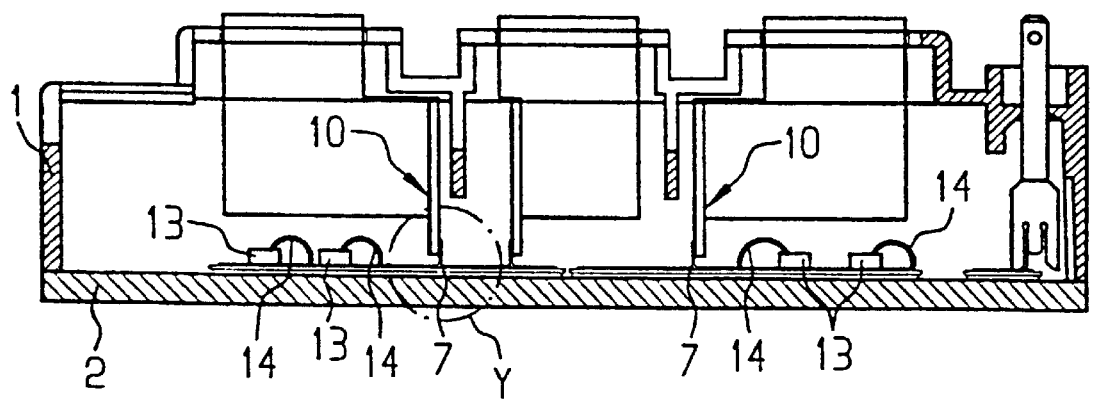
FIG. 3 is a sectional side view of a power semiconductor module according to the invention in the section plane I—I shown in FIG. 1 with grip tabs which have been bent vertically upward.

Referring now to the figures of the drawings in detail and first, particularly, to FIG. 1 thereof, there is shown a plan view of a power semiconductor module, the housing cover of which has been removed. The power semiconductor module includes a plastic housing 1 and a metallic base plate 2, which is inserted into an opening at the bottom of the plastic housing 1. This can also be seen more clearly from FIGS. 2 and 3. FIGS. 2 and 3 show side views, in the section plane I—I, which is shown in FIG. 1.

The power semiconductor module includes a plurality of ceramic substrates 4 which are placed on the metallic base plate 2. The ceramic substrates 4 in this case are formed of aluminum oxide $Al_2O_3$ and have a continuous metal layer 9 on their underside 6. Via this metal layer 9, the ceramic substrates 4 are joined to the upper side 7 of the metallic base plate 2 via a soft-soldered joint 16, as can be seen in particular from FIGS. 4 and 5. There is also a metalization 8, which is structured and includes a copper foil produced by a direct copper bonding process, on the upper side 5 of the ceramic substrates 4. There are semiconductor components 13 on this structured metalization 8. The semiconductor components 13 are soldered to the metalization 8. The semiconductor components 13 and the structured metalization 8 are additionally joined to one another by bonded joints 14 produced by wire bonders.

Figure 4:
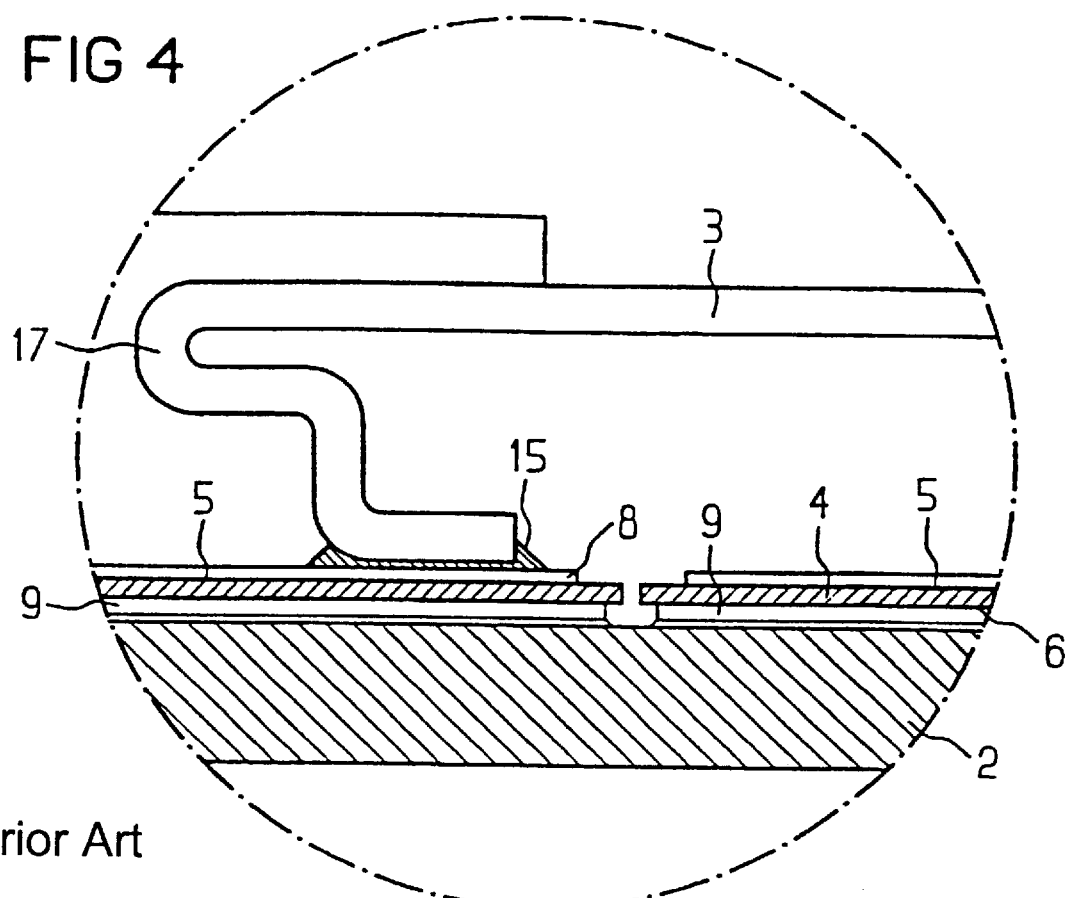
FIG. 4 is an enlarged detail of the sectional side view of the conventional power semiconductor module of FIG. 2, showing the area indicated by X.

Furthermore, connecting elements 3, which in FIGS. 2 and 4 are in the form of sheet-metal strips provided with compensating curves, are provided on the upper side 5 of the ceramic substrates. The connection points of the connection elements on the metalization 8 can be seen in FIG. 1. The connection elements according to the prior art are applied to these connection points via a soft-soldered joint 15.

FIG. 2 and FIG. 4 show connection elements 3 which are formed, for example, of a metal strip, which is approximately 1 mm thick and approximately 3 mm wide and is produced, for example, from copper. This metal strip has an expansion curve 17.

Figure 5:
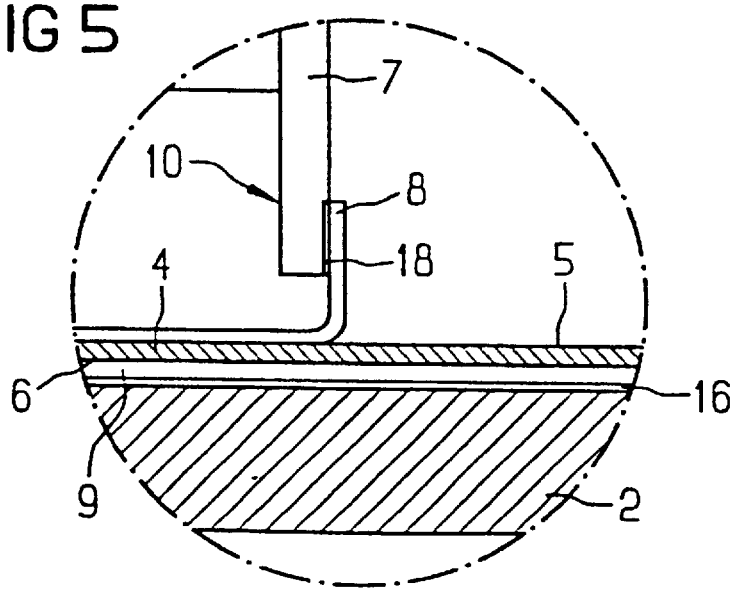
FIG. 5 is an enlarged detail of the sectional side view of the power semiconductor module according to the invention of FIG. 3, showing the area indicated by Y.

According to the present invention, these connection elements 3 with expansion curves 17 are replaced by the metalization 8 on the upper side 5 of the ceramic substrates 4, in the region of the corners of the ceramic substrates, being bent vertically upward to form a grip tab 10 and by connection elements 7 without expansion curves being directly joined to the ends of the upwardly bent metalization ends via a brazed (hard-soldered) joint 18 or a welded joint, as illustrated in FIG. 3 and FIG. 5.

As can be seen from FIG. 5, both the location of the joint and the connection elements themselves take up less space. Since the connection points are no longer soft-soldered joints, but rather are brazed or welded joints, far better stability with respect to fluctuating thermal loads is ensured. The grip tabs may be detached mechanically from the ceramic substrates through the use of a detaching tool, in which case local undercut etching of the metalization edges at the detachment point assists with the detaching operation.

In an alternative procedure, the metalization can be carried out through the use of a local heat treatment. In this case, it is conceivable to use a laser in an inert-gas atmosphere to detach the metalization from the ceramic substrate.

In a third procedure, those parts of the metalization which are to be bent up are not soldered to the ceramic substrate from the outset, by not applying any solder to the ceramic substrate for the corresponding partial areas. This procedure is particularly advantageous in the case of aluminum nitride ceramic substrates, since currently the metalization cannot be detached from such substrates afterwards, i.e. after being soldered to the substrate.

We claim:

1. A power semiconductor module, comprising:
   a plastic housing having a bottom opening;
   a connection element;
   at least one ceramic substrate having an upper side and being inserted into said bottom opening of said plastic housing;
   a structured metalization provided at least at said upper side of said at least one ceramic substrate, at least a part of said structured metalization being detached from said at least one ceramic substrate and being bent vertically upward forming a grip tab; and
   a brazed joint joining said grip tab to said connection element.

2. The power semiconductor module according to claim 1, wherein said at least one ceramic substrate is an aluminum oxide substrate including $Al_2O_3$.

3. The power semiconductor module according to claim 1, wherein said at least one ceramic substrate is an aluminum nitride substrate including AlN.

4. The power semiconductor module according to claim 1, wherein said structured metalization is a copper metalization.

5. The power semiconductor module according to claim 1, wherein:
   said structured metalization has a surface; and
   a nickel layer is provided on said surface of said structured metalization.

6. The power semiconductor module according to claim 1, wherein said plastic housing includes a frame and a cover.

7. The power semiconductor module according to claim 6, wherein said cover has openings formed therein, and at least some of said connection elements are guided through said openings.

8. The power semiconductor module according to claim 1, further comprising semiconductor components provided on said at least one ceramic substrate.

9. The power semiconductor module according to claim 1, wherein said connection element is one of a plurality of connection elements for external main connections and control connections.

10. A power semiconductor module, comprising:

a plastic housing having a bottom opening;

a connection element;

at least one ceramic substrate having an upper side and being inserted into said bottom opening of said plastic housing;

a structured metalization provided at least at said upper side of said at least one ceramic substrate, at least a part of said structured metalization being detached from said at least one ceramic substrate and being bent vertically upward forming a grip tab; and a welded joint joining said grip tab to said connection element.

11. The power semiconductor module according to claim 10, wherein said at least one ceramic substrate is an aluminum oxide substrate including $Al_2O_3$.

12. The power semicondctor module according to claim 10, wherein said at least one ceramic substrate is an aluminum nitride substrate including AlN.

13. The power semiconductor module according to claim 10, wherein said structured metalization is a copper metalization.

14. The power semiconductor module according to claim 10, wherein:

said structured metalization has a surface; and a nickel layer is provided on said surface of said structured metalization.

15. The power semiconductor module according to claim 10, wherein said plastic housing includes a frame and a cover.

16. The power semiconductor module according to claim 15, wherein said cover has openings formed therein, and at least some of said connection elements are guided through said openings.

17. The power semiconductor module according to claim 10, further comprising semiconductor components provided on said at least one ceramic substrate.

18. The power semiconductor module according to claim 10, wherein said connection element is one of a plurality of connection elements for external main connections and control connections.

* * * * *

UNITED STATES PATENT AND TRADEMARK OFFICE
CERTIFICATE OF CORRECTION

PATENT NO. : 6,597,585 B2
DATED : July 22, 2003
INVENTOR(S) : Gottfried Ferber et al.

It is certified that error appears in the above-identified patent and that said Letters Patent is hereby corrected as shown below:

<u>Title page,</u>
Item [30], should read as follows:

-- Foreign Application Priority Data

Mar. 17, 1999     (DE) ............... 199 11 953 --

Signed and Sealed this

Fourth Day of November, 2003

JAMES E. ROGAN
*Director of the United States Patent and Trademark Office*